United States Patent
Berman et al.

(10) Patent No.: US 10,802,083 B2
(45) Date of Patent: Oct. 13, 2020

(54) EVSE WELDED CONTACTOR DETECTOR

(71) Applicant: Webasto Charging Systems, Inc., Simi Valley, CA (US)

(72) Inventors: Scott Garret Berman, Los Angeles, CA (US); Albert Flack, Lake Arrowhead, CA (US); Keith Kolb, Laverne, CA (US); Ming Bai, Porter Ranch, CA (US)

(73) Assignee: Webasto Charging Systems, Inc., Simi Valley, CA (US)

( * ) Notice: Subject to any disclaimer, the term of this patent is extended or adjusted under 35 U.S.C. 154(b) by 564 days.

(21) Appl. No.: 14/403,570

(22) PCT Filed: May 24, 2013

(86) PCT No.: PCT/US2013/042776
§ 371 (c)(1),
(2) Date: Nov. 24, 2014

(87) PCT Pub. No.: WO2013/177582
PCT Pub. Date: Nov. 28, 2013

(65) Prior Publication Data
US 2015/0115966 A1 Apr. 30, 2015

Related U.S. Application Data

(60) Provisional application No. 61/651,548, filed on May 24, 2012.

(51) Int. Cl.
*G01R 31/02* (2006.01)
*G01R 31/58* (2020.01)
(Continued)

(52) U.S. Cl.
CPC .............. *G01R 31/58* (2020.01); *B60L 3/003* (2013.01); *B60L 3/0023* (2013.01); *B60L 53/16* (2019.02);
(Continued)

(58) Field of Classification Search
CPC .... B60L 3/0023; B60L 3/003; B60L 11/1818; B60L 11/18; B60L 2250/16;
(Continued)

(56) References Cited

U.S. PATENT DOCUMENTS

| 5,233,312 A | 8/1993 | Duft et al. |
| 6,678,132 B1 * | 1/2004 | Carruthers ............ B60L 3/0023 361/42 |

(Continued)

FOREIGN PATENT DOCUMENTS

| CN | 1700573 A | 11/2005 |
| CN | 101526578 A | 9/2009 |

OTHER PUBLICATIONS

International Searching Authority; International Search Report (ISR) for corresponding PCT case application No. PCT/US2013/042776 entitled EVSE welded contactor detector by Flack et al.; dated Oct. 24, 2013 from US International Searching Authority; 2 pgs.
(Continued)

*Primary Examiner* — Douglas X Rodriguez
*Assistant Examiner* — Brent J Andrews
(74) *Attorney, Agent, or Firm* — Christopher R. Balzan, Esq.; Eric J. Aagaard, Esq.

(57) ABSTRACT

In at least one embodiment, provided is an electric vehicle supply equipment having a line power contactor including a first line power input and a second line power input and a first line power output and a second line power output. It further has a welded contactor detector with a contactor sense circuit, the sense circuit having a first line shunt
(Continued)

resistor network connected from the first line power contactor output to ground and a second line shunt resistor network connected from the first line power contactor output to ground. In another embodiment provided is an EVSE including a welded contactor detector with a contactor sense circuit having a bias resistor connected between the hot line relay input and the neutral line relay output.

12 Claims, 4 Drawing Sheets

(51) Int. Cl.
    *B60L 3/00*         (2019.01)
    *B60L 53/16*       (2019.01)
    *G01R 31/00*      (2006.01)

(52) U.S. Cl.
    CPC ...... *G01R 31/005* (2013.01); *B60L 2240/527* (2013.01); *B60L 2250/16* (2013.01); *Y02T 10/7005* (2013.01); *Y02T 10/7072* (2013.01); *Y02T 90/14* (2013.01)

(58) Field of Classification Search
    CPC ............ B60L 2240/527; G01R 31/005; G01R 31/021; G01R 31/00; G01R 31/02; Y02T 10/7072; Y02T 10/7005; Y02T 90/14
    See application file for complete search history.

(56) References Cited

U.S. PATENT DOCUMENTS

| | | | |
|---|---|---|---|
| 7,130,170 B2 | 10/2006 | Wakefield et al. | |
| 7,966,110 B2 | 6/2011 | Tarchinski | |
| 9,267,974 B2 | 2/2016 | Flack et al. | |
| 2005/0254275 A1 | 11/2005 | Nojima et al. | |
| 2010/0289516 A1* | 11/2010 | Mitsutani | B60L 3/00 324/764.01 |
| 2011/0216451 A1 | 9/2011 | Haines et al. | |
| 2011/0298470 A1* | 12/2011 | Gokhale | H02M 1/32 324/522 |

OTHER PUBLICATIONS

International Searching Authority; Written Opinion (WO) of the International Searching Authority and Search History for related PCT case application No. PCT/US2013/042776 entitled EVSE welded contactor detector by Flack et al.; dated Oct. 24, 2013 from US International Searching Authority; 10 pgs.

The State Intellectual Property Office of the People's Republic of China (SIPO); English translation of First Office Action (1OA) for corresponding case Chinese application No. 201380039233.6 entitled EVSE welded contactor detector by Albert Flack et al.; dated May 4, 2016, from the State Intellectual Property Office of the People's Republic of China; 7 pgs.

The State Intellectual Property Office of the People's Republic of China (SIPO); English translation of Search Report (Search_Rpt) for corresponding case Chinese application No. 201380039233.6 entitled EVSE welded contactor detector by Albert Flack et al.; dated Apr. 24, 2016, from the State Intellectual Property Office of the People's Republic of China; 2 pgs.

\* cited by examiner

EVSE WELDED CONTACTOR DETECTOR

CROSS REFERENCE TO RELATED APPLICATIONS

The present application claims the benefit of U.S. Provisional Application 61/651,548, filed May 24, 2012, by Flack et al., entitled EVSE WELDED CONTACTOR DETECTOR, herein incorporated by reference in its entirety.

The present application is related to U.S. patent application Ser. No. 13/655,144, filed Oct. 18, 2012, by Flack et al., entitled CONTACTOR HEALTH MONITOR CIRCUIT AND METHOD, which is a continuation of PCT application PCT/US2011/033134, by Flack, entitled CONTACTOR HEALTH MONITOR CIRCUIT AND METHOD, filed 19 Apr. 2011, which claims the priority of U.S. Provisional Application 61/325,791, by Flack, entitled CONTACTOR HEALTH MONITOR CIRCUIT, filed 18 Apr. 2010, all hereby incorporated by reference in their entireties.

BACKGROUND

A fixed EVSE (Electric Vehicle Supply Equipment) or a portable EVSE (sometimes referred to as a cord set) is used to supply AC power from the electric utility to an electric vehicle. One of the safety requirements of an EVSE is to determine when either contact of the contactor is stuck closed and indicate the failure to the user.

SUMMARY

In at least one embodiment, provided is an electric vehicle supply equipment having a line power contactor including a first line power input and a second line power input and a first line power output and a second line power output. It further has a welded contactor detector with a contactor sense circuit, the sense circuit having a first line shunt resistor network connected from the first line power contactor output to ground and a second line shunt resistor network connected from the first line power contactor output to ground.

In another embodiment provided is an electric vehicle supply equipment including a welded contactor detector with a contactor sense circuit having a bias resistor connected between the hot line relay input and the neutral line relay output.

DESCRIPTION

A contactor is determined to be stuck closed (welded or otherwise mechanically stuck) when the voltage measured at either VO1 or VO2 is greater than a maximum safe voltage while the contactor is commanded open by the EVSE controller 121. For some applications, the maximum safe voltage is set at 24 Vrms.

Figure 1:
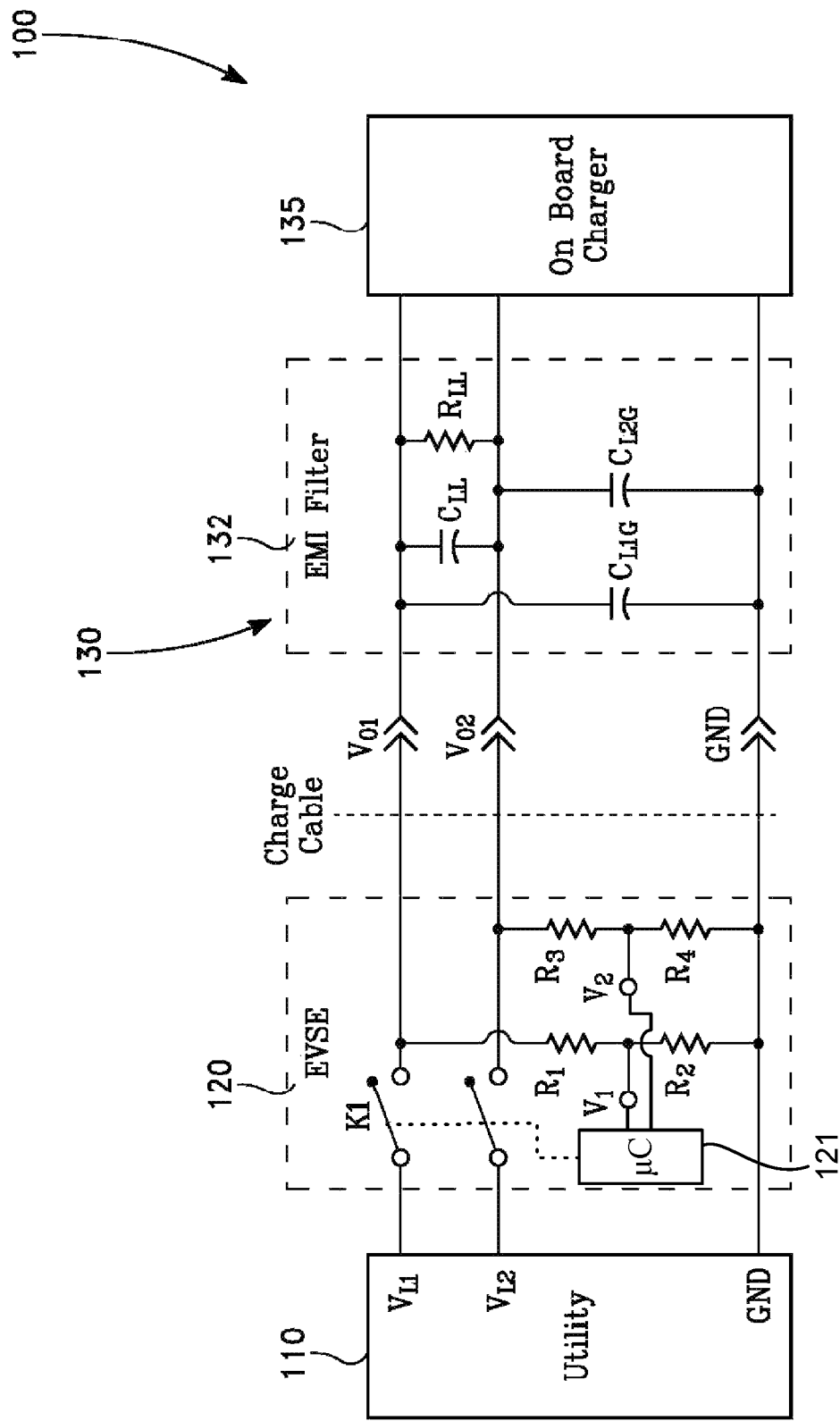
FIG. 1 shows one embodiment of a simplified power circuit schematic for charging an electric vehicle.

FIG. 1 shows one embodiment of a simplified power circuit schematic for charging an electric vehicle. FIG. 1 shows the power circuit 100 between the electric utility 110, through an EVSE 120 to an electric vehicle 130, which may include an EMI filter 132 and an on board charger 135. The utility 110 is symbolized as voltage sources $V_{L1}$ and $V_{L2}$. The EVSE 120 shown in this diagram consists of the contactor K1 and voltage monitoring resistors R1-R4. Finally, the vehicle's input EMI filter capacitors $C_{L1G}$ and $C_{L2G}$, and $C_{LL}$, followed by the on board charger 135 are shown.

In the circuit 100 of FIG. 1, $R_1=R_3=3$ Mohms; $R_2=R_4=10$ Kohms; $C_{L1G}=C_{L2G}=0.1$ uF; and $R_{LL}=100$ Kohms.

The EVSE output voltages are measured by the EVSE 120 microcontroller 121 at nodes $V_1$ and $V_2$. Voltage dividers R1, R2 and R3, R4 are used to reduce the output voltage to a level measureable by an analog to digital converter of the microcontroller 121 within the EVSE 120.

The welded contactor detector algorithm must determine whether the contactor is welded when the EVSE 120 is connected or disconnected from the vehicle. As seen in FIG. 1, the vehicle 130 may have significant capacitance as shown by $C_{LL}$, $C_{L1G}$ and $C_{L2G}$. This capacitance results in output voltage measurable on the output terminals of the EVSE's contactor K1 long after the contactor K1 has opened.

There are two time constants affecting the line to ground voltages measured at the output terminals. One time constant is formed by the output measurement resistors $R_1$ and $R_2$ (or $R_3$ and $R_4$) and the line to ground capacitance $C_{L1G}$ (or $C_{L2G}$). For example, the voltage is discharged with a time constant equal to $(R_1+R_2)*C_{L1G}$ which is about 300 milliseconds. This will result in a maximum time of 585 ms to fall from the peak line voltage of 169V to the maximum safe voltage of 24V.

The other time constant is significantly longer. It is formed from the line to line capacitance $C_{LL}$, and the line to line resistance $R_{LL}$. In this example, the voltage will be discharged with a time constant of about is resulting in a maximum time of approximately 2 seconds to fall to a maximum safe voltage of 24V.

Figure 2:
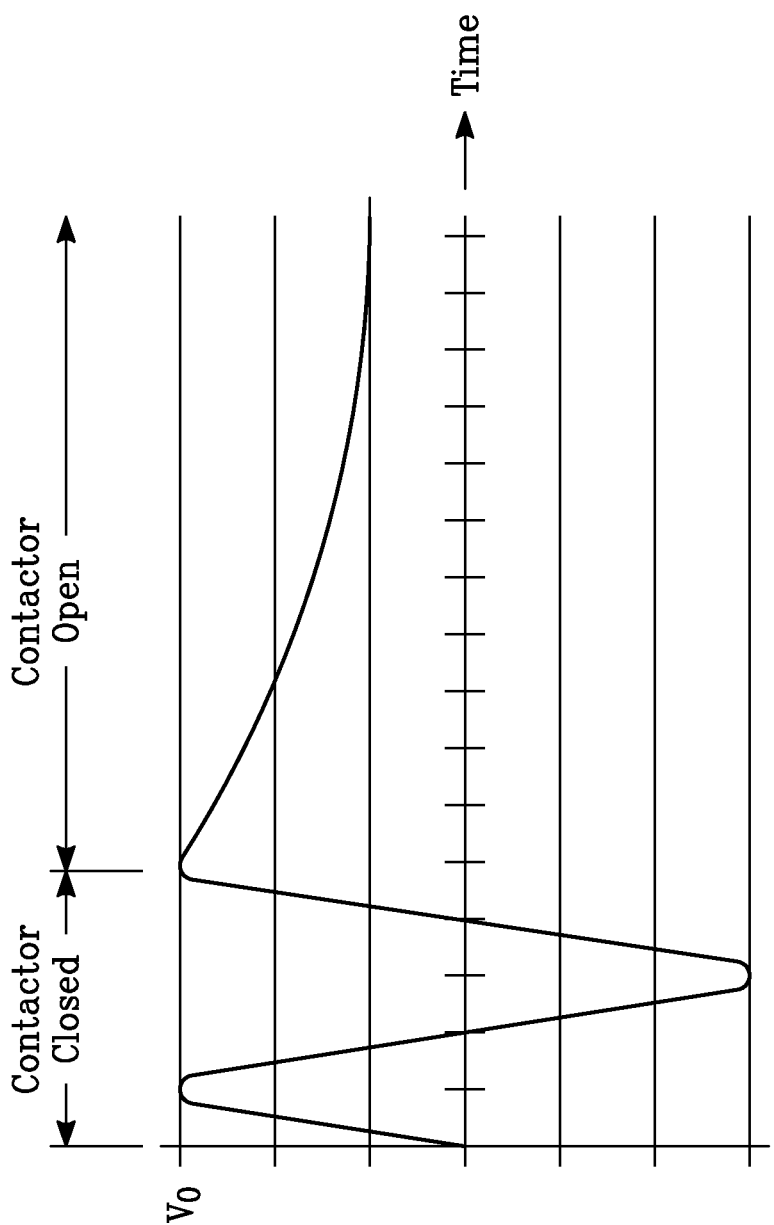
FIG. 2 shows the output voltage measured at the contactor output before and after the contactor opens when connected to a vehicle with input capacitance.

FIG. 2 shows the output voltage measured at the contactor output before and after the contactor opens when connected to a vehicle with input capacitance as described above. The waveform consists of an AC and DC component. Where $V_{max}e^{**}(t/\tau)$, where $\tau=2$ s.

Traditionally, the output voltage is measured using an RMS voltage calculation of the form $$V_{rms} = \sqrt{\frac{1}{N}\sum_{n=0}^{N-1} v_n^2} \qquad \text{Equation 1.}$$

where $v_n$ is the sampled input voltage and N is the number of samples.

This Equation 1 may be used to calculate the RMS voltage each cycle or continuously on an on-going basis to calculate the RMS voltage $V_{rms}$. In one implementation, it is possible to use the cycle calculation where N is a fixed number of samples per 60 Hz period.

Using Equation 1 above to calculate the output voltage results in false welded contactor detection after the contactor is opened since the output voltage slowly discharges after the contactor is opened. Feeding that DC voltage into Equation 1 will result in a large $V_{rms}$ measurement until the capacitor voltage bleeds down.

Since the test is whether or not the contactor is welded, and the utility voltage only contains an AC component, the DC component is removed from the RMS calculation to determine if the contactor is welded.

Thus, in one implementation a generalized equation of the input voltage that contains both AC and DC voltage components is used.

$$v_n = V_{ac} \sqrt{2} \sin\left(2\pi \frac{n}{N}\right) + V_{dc} \qquad \text{Equation 2.}$$

where $V_{ac}$ is the AC voltage component, $V_{dc}$ is the DC voltage component, n is the sample number and N is the number of samples per period.

The DC component of the sampled voltage can be determined by calculating the mean of the samples within a cycle (eg 60 Hz cycle). Equation 3 is used to calculate the DC component of the sample.

$$V_{dc} = \frac{1}{N} \sum_{n=0}^{N-1} v_n \qquad \text{Equation 3.}$$

The AC component of the sampled voltage can then be calculated by applying Equation 1 to the difference of the sampled voltage and the DC component calculated in Equation 3 as shown in Equation 4 below.

$$V_{ac} = \sqrt{\frac{1}{N} \sum_{n=0}^{N-1} (v_n - V_{dc})^2} \qquad \text{Equation 4.}$$

The AC component is then used to determine the contactor status. A fault is considered when the $V_{ac}$ component of either $V_1$ or $V_2$ is greater than 24V while the contactor K1 is commanded to be open. This technique results in a very fast determination of the contactor status as Equation 4 is calculated for each utility voltage cycle.

Figure 3:
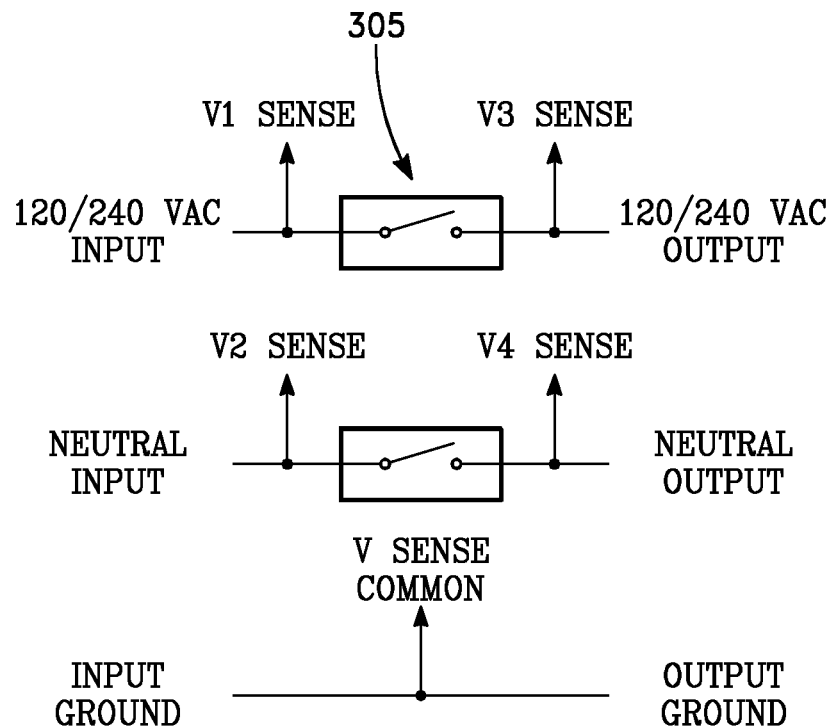
FIG. 3 is a simplified schematic illustration depicting a relay circuit.
Figure 4:
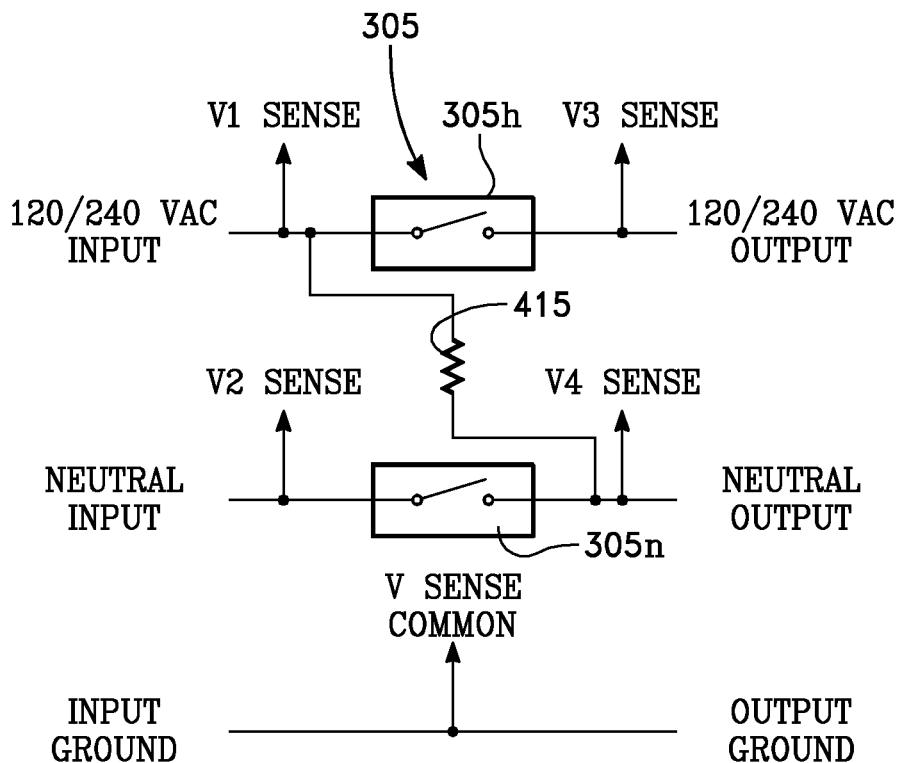
FIG. 4 is a simplified schematic illustration depicting a relay circuit.
Figure 5:
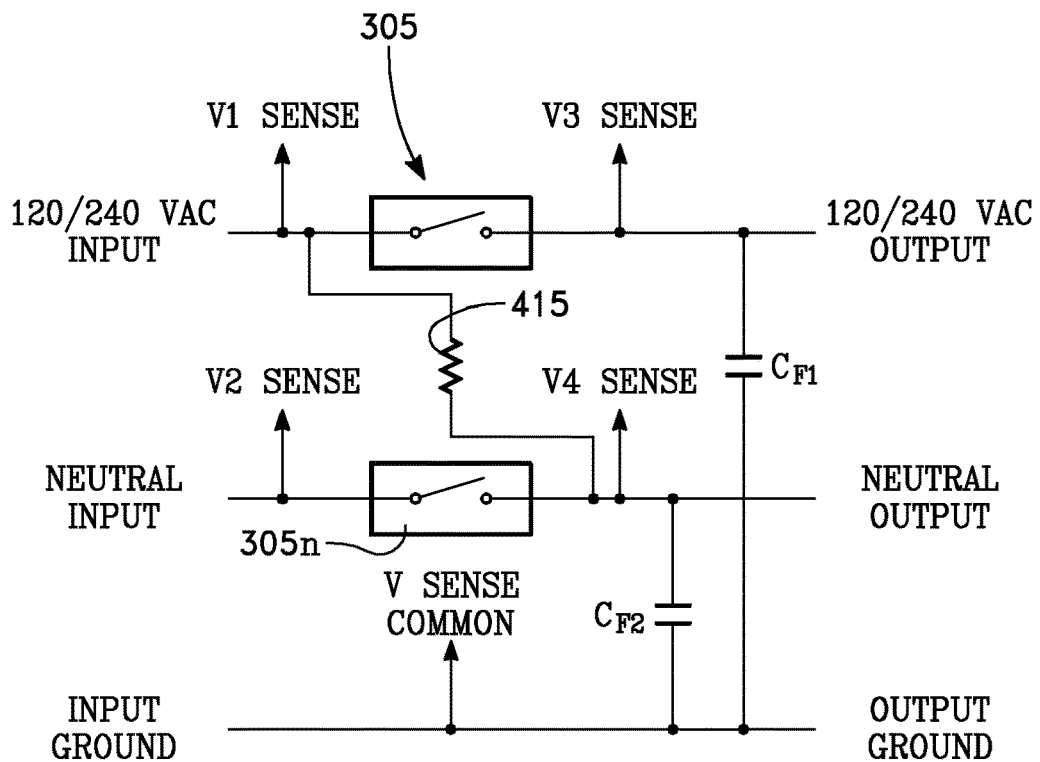
FIG. 5 is a simplified schematic illustration depicting a relay circuit.

Referring to FIGS. 3-5, the cord set is an EVSE that connects 120 VAC or 240 vac phase grounded power to an electric vehicle (EV) having an on board charger. As with the fixed EVSE, one of the UL requirements is that the output power relays must be monitored to verify that they open when expected and close when expected. This is to protect against a "welded" contact or stuck, failed relay condition. This is easy for the relay contact that passes the "hot" line power because it will have either full line voltage when closed or zero voltage when open. The "neutral" line in a phase grounded system has the disadvantage of being at zero volts with respect to ground whether it is open or closed, so a simple voltage reading does not suffice to verify the contact condition. This is the problem that the following circuit and operation addresses.

As stated above, the neutral has no active voltage level with respect to ground. As a result, the circuit shown in FIG. 3 cannot easily determine the closed or open state of the relay contacts. A reading of zero volts on the neutral output line provides no information.

For FIG. 3, when the relay 305 is open, V1 SENSE is 120 v (or 240 v), V2 SENSE is 0 v, V3 SENSE is 0 v, V4 SENSE is 0 v. When the relay 305 is closed, V1 SENSE is 120 v (or 240 v), V2 SENSE is 0 v, V3 SENSE is 120 v (or 240 v), and V4 SENSE is 0 v.

Turning to FIG. 4, adding a bias resistor 415 from the "hot" source line 120/240 VAC INPUT to the neutral output line (referenced as NEUTRAL OUTPUT) has the effect of pulling the NEUTRAL OUTPUT up in voltage when the relay 305 is open. The contacts can be determined as open when a voltage is read on the NEUTRAL OUTPUT because the neutral input (referenced as NEUTRAL INPUT) is at zero volts. This bias resistor 415 must be high enough in resistance so that leakage current does not pose a hazard to the user.

For FIG. 4, when the relay 305 is open, V1 SENSE is 120 v (or 240 v), V2 SENSE is 0 v, V3 SENSE is 0 v, and V4 SENSE is near 120 v (or 240 v). When the relay 305 is closed, V1 SENSE is 120 v (or 240 v), V2 SENSE is 0 v, V3 SENSE is 120 v (or 240 v), and V4 SENSE is 0 v.

This variation allows the condition of the neutral relay 305n to be determined by the voltage reading on the NEUTRAL OUTPUT line. Parallel impedances that may exist in the EV charger front end can affect this voltage reading. For instance, the filter capacitors $C_{F1}$ and $C_{F2}$ that are generally present on most EV charger inputs can have a significant effect on the voltage reading of V4 SENSE. An example of this is shown in FIG. 5.

For FIG. 5, when the relay is open, V1 SENSE is 120 v (or 240 v), V2 SENSE is 0 v, V3 SENSE is 0 v, and V4 SENSE is above 0 v. When the relay 305 is closed, V1 SENSE is 120 v (or 240 v), V2 SENSE is 0 v, V3 SENSE is 120 v (or 240 v), V4 SENSE is 0 v.

The amount of capacitance and the resistance of bias resistor 415 will determine the actual voltage that is seen at the NEUTRAL OUTPUT line when the relay 305 is open. A simple check for some voltage on that line is all that is needed to verify the relay contact is not closed. Choosing a low voltage, such as 10 volts, will in many cases be sufficient and provide margin for error.

This capacitance is variable and an unknown factor in making the cord set universal in its ability to mate with any EV on the market. The resistor values can be chosen by empirical means for a range of the EV filter capacitors $C_{F1}$, $C_{F2}$ values.

The value for bias resistor 415 can be chosen based on the conditions of the EV filter and charger characteristics. In one specific embodiment, a 330 Kohm for the bias resistor 415, for EV FILTER CAPACITOR values of about 0.01-0.02 uF.

Figure 6:
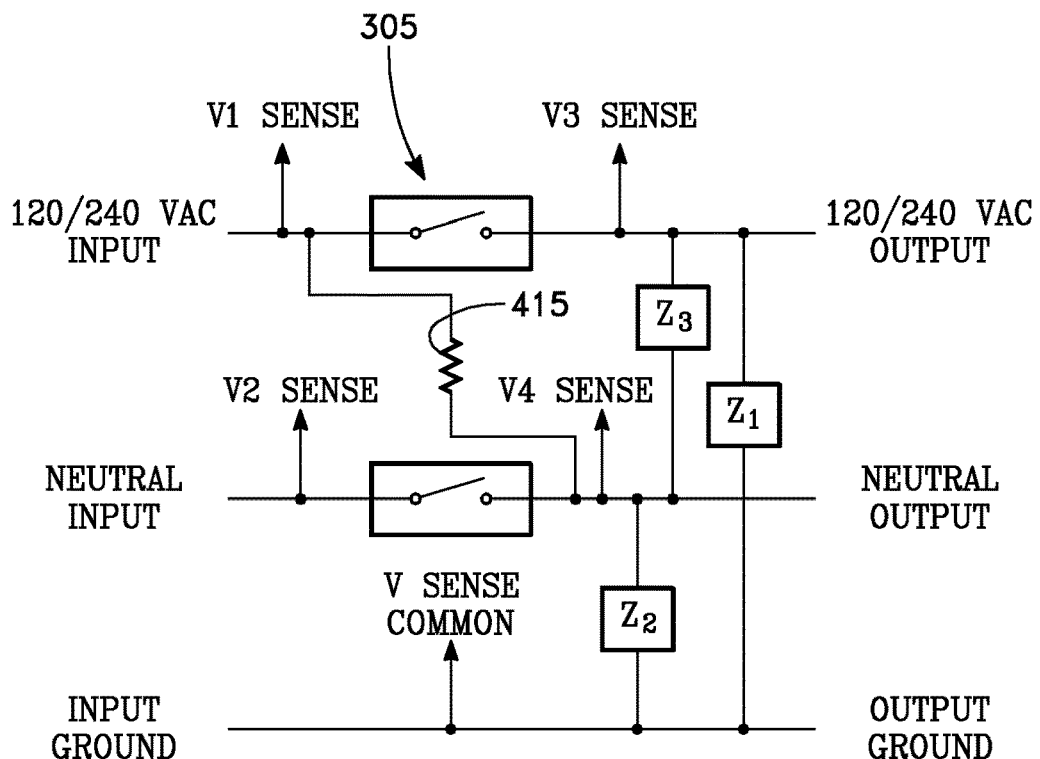
FIG. 6 is a simplified schematic illustration depicting a relay circuit.

As illustrated in FIG. 6, there are also resistive elements across the power lines from internal cord set monitoring circuits and from EV charger components as well. All the capacitive and resistive devices can be summarized as compound complex impedances $Z_1$, $Z_2$, and $Z_3$ as shown in FIG. 6.

A processor or microcontroller 121 in the EVSE may be used to determine if the input and output voltage readings show open or closed contacts based on the sensed voltages discussed above. This, along with the software being in a state that expects one case or the other, allows detection for the open condition when it should be closed, or the closed condition when it should be open. Faults are then expressed on the cord set.

Various delays in voltage retention by capacitive elements and discharge profiles combine with the software to define the values that a monitored voltage will have over time for best state determination.

It is worthy to note that any reference to "one embodiment" or "an embodiment" means that a particular feature, structure, or characteristic described in connection with the embodiment may be included in an embodiment, if desired. The appearances of the phrase "in one embodiment" in various places in the specification are not necessarily all referring to the same embodiment.

The illustrations and examples provided herein are for explanatory purposes and are not intended to limit the scope of the appended claims. This disclosure is to be considered an exemplification of the principles of the invention and is not intended to limit the spirit and scope of the invention and/or claims of the embodiment illustrated.

Those skilled in the art will make modifications to the invention for particular applications of the invention.

The discussion included in this patent is intended to serve as a basic description. The reader should be aware that the specific discussion may not explicitly describe all embodiments possible and alternatives are implicit. Also, this discussion may not fully explain the generic nature of the invention and may not explicitly show how each feature or element can actually be representative or equivalent elements. Again, these are implicitly included in this disclosure. Where the invention is described in device-oriented terminology, each element of the device implicitly performs a function. It should also be understood that a variety of changes may be made without departing from the essence of the invention. Such changes are also implicitly included in the description. These changes still fall within the scope of this invention.

Further, each of the various elements of the invention and claims may also be achieved in a variety of manners. This disclosure should be understood to encompass each such variation, be it a variation of any apparatus embodiment, a method embodiment, or even merely a variation of any element of these. Particularly, it should be understood that as the disclosure relates to elements of the invention, the words for each element may be expressed by equivalent apparatus terms even if only the function or result is the same. Such equivalent, broader, or even more generic terms should be considered to be encompassed in the description of each element or action. Such terms can be substituted where desired to make explicit the implicitly broad coverage to which this invention is entitled. It should be understood that all actions may be expressed as a means for taking that action or as an element which causes that action. Similarly, each physical element disclosed should be understood to encompass a disclosure of the action which that physical element facilitates. Such changes and alternative terms are to be understood to be explicitly included in the description.

Having described this invention in connection with a number of embodiments, modification will now certainly suggest itself to those skilled in the art. The example embodiments herein are not intended to be limiting, various configurations and combinations of features are possible. As such, the invention is not limited to the disclosed embodiments, except as required by the appended claims.

What is claimed is:

1. An electric vehicle supply equipment comprising:
   a) a line power contactor comprising:
      i) a first line power input and a second line power input; and
      ii) a first line power output and a second line power output;
   b) a welded contactor detector comprising a contactor sense circuit, the sense circuit comprising:
      i) a first line shunt resistor network connected from the first line power contactor output to ground; and
      ii) a second line shunt resistor network connected from the first line power contactor output to ground;
   c) a microcontroller connected to receive voltage outputs from the sense circuit, the microcontroller being configured to detect an amount of AC voltage present at the sense circuit after the line power contactor is commanded open by the microcontroller; and
   d) wherein the microcontroller is adapted to:
      (i) sample a voltage output from the sense circuit, the voltage output sample comprising AC and DC components;
      (ii) determine a DC component of a set of samples of the voltage output from the sense circuit;
      (iii) subtract the DC component from the voltage output sample to determine an AC component of the voltage output from the sense circuit; and
      (iv) compare the AC component of the voltage output from the sense circuit to a threshold value to determine whether the line power contactor is welded.

2. The electric vehicle supply equipment of claim 1, wherein the first line shunt resistor network comprises series connected first and second resistors, and wherein the second line shunt resistor network comprises series connected third and fourth resistors.

3. The electric vehicle supply equipment of claim 2, wherein sense circuit comprises a first output and a second output, and wherein the sense circuit first output is located between the first and second series connected resistors, and wherein the sense circuit second output is located between the third and fourth series connected resistors.

4. The electric vehicle supply equipment of claim 1, wherein the electric vehicle supply equipment is a fixed mounted electric vehicle supply equipment.

5. An electric vehicle supply equipment comprising:
   a) a contractor comprising:
      i) only one hot source line relay comprising an input and an output;
      ii) only one neutral line relay comprising an output; and
      iii) wherein closing the contactor closes both the hot source line relay and the neutral line relay and opening the contactor opens both the hot source relay and the neutral line relay;
   b) a welded relay detector comprising a contactor sense circuit, the sense circuit comprising a bias resistor connected from the hot line relay input and the neutral line relay output such that the bias resistor has the effect of pulling the neutral line relay output up in voltage when the neutral line relay is open; and
   c) a microcontroller connected to receive sensed voltage signals from the sense circuit, the microcontroller being configured to detect an amount of AC voltage present at the sense circuit after the contactor is commanded open by the microcontroller.

6. The electric vehicle supply equipment of claim 5, wherein the microcontroller is adapted to indicate a failure of the neutral line relay if a signal above a predetermined threshold is not sensed at an output of the neutral line relay when the neutral line relay is commanded open.

7. The electric vehicle supply equipment of claim 5, wherein the microcontroller is adapted to indicate a failure of the hot line relay if a signal above a predetermined threshold is sensed at an output of the hot line relay when the relays are commanded open.

8. The electric vehicle supply equipment of claim 5, wherein the bias resistor comprises a resistance selected based on an impedance of an electric vehicle filter and charger.

9. The electric vehicle supply equipment of claim 5, wherein the bias resistor has sufficiently high resistance to inhibit leakage current.

10. The electric vehicle supply equipment of claim 9, wherein the bias resistor is at least 330 Kohms.

11. The electric vehicle supply equipment of claim 5, wherein the electric vehicle supply equipment is a portable cord set electric vehicle supply equipment.

12. A method for providing a rapid determination of an open/closed status of a contactor in an electric vehicle supply equipment, the method comprising:
   a) sensing a voltage level comprising AC and DC components at a contactor output;
   b) detecting an AC component of a line voltage at an output of the contactor after the contactor has been commanded open comprising:
      i) Sampling the sensed voltage level at the output of the contactor;
      ii) determining a DC component of the line voltage from a set of samples of the sensed voltage level; and
      iii) subtracting the DC component of the line voltage from the line voltage at the output of the contactor to determine an AC component of the line voltage at the output of the contactor;
   b) comparing the AC component of the line voltage at the output of the contactor to a threshold value to determine whether the contactor is closed; and
   c) indicating a failure to a user if the contactor is determined to be closed.

\* \* \* \* \*